United States Patent
Chi

[11] Patent Number: 6,143,607
[45] Date of Patent: Nov. 7, 2000

[54] METHOD FOR FORMING FLASH MEMORY OF ETOX-CELL PROGRAMMED BY BAND-TO-BAND TUNNELING INDUCED SUBSTRATE HOT ELECTRON AND READ BY GATE INDUCED DRAIN LEAKAGE CURRENT

[75] Inventor: Min-hwa Chi, Hsinchu, Taiwan

[73] Assignee: Taiwan Semiconductor Manufacturing Corp, Hsinchu, Taiwan

[21] Appl. No.: 09/411,133

[22] Filed: Oct. 1, 1999

Related U.S. Application Data

[63] Continuation-in-part of application No. 09/378,197, Aug. 19, 1999.

[51] Int. Cl.[7] .................................................. H01L 21/336
[52] U.S. Cl. ......................... 438/257; 438/264; 438/263; 257/315; 257/321
[58] Field of Search .................................. 438/261, 262, 438/257, 264, 594, 258, 263, 265, 267; 257/314, 315, 319, 326, 321; 365/185.01, 185.26

[56] References Cited

U.S. PATENT DOCUMENTS 5,346,842  9/1994  Bergemont ............................. 438/258
5,814,854  9/1998  Liu et al. ............................... 257/315

*Primary Examiner*—Charles Bowers
*Assistant Examiner*—Hsien-Ming Lee
*Attorney, Agent, or Firm*—Blakely, Sokoloff, Taylor & Zafman LLP

[57] ABSTRACT

A method of forming an ETOX-cell in a semiconductor substrate is disclosed. The method begins with forming a p-well in the substrate. Then, a drain region and a source region is formed in the p-well. The drain region is of a first dopant type and the source region is of a second dopant type (i.e. same as the dopant type of the p-well). A floating-gate and tunnel oxide stack is formed above the p-well, the floating gate formed between the drain region and the source region and only after the drain region and the source region have been formed. The floating gate is doped with the same dopant type as the p-well. Finally, a control gate is formed above the floating-gate, the floating-gate and the control gate separated by a dielectric layer. The new ETOX cells can be organized into a NOR array, but with no need of source line connections. Each cell is programmed by band-to-band induced substrate hot-electron (BBISHE) at the source, and read by GIDL at the drain side.

5 Claims, 7 Drawing Sheets

NEW ETOX-LIKE PROCESS FLOW:
1. ISOLATION FORMATION (STI)
   - OXDE GROWN, NITRIDE DEP
   - ACTIVE AREA MASKING, ETCHING
   - CVD FILL, CMP PLANARIZATION
2. TRIPLE WELL FORMATION:
   - DEEP N-WELL MASKING AND DEEP N-WELL IMPLANT.
   - N-WELL MASKING AND N-WELL IMPLANT.
   - P-WELL MASKING AND P-WELL IMPLANT.
3. BURIED N+, P+ LAYERS:
   - BURIED N+ MASKING AND N+ IMPLANT.
   - BURIED P+ MASKING AND P+ IMPLANT.
4. FLASH CELL FORMATION:
   - TUNNEL OX GROWN.
   - POLY-1 DEP, P+ IMPLANT (DOPING),
   - FLOATING-GATE MASKING AND ETCHING.
   - ONO DEPOSITION.
5. TRANSISTOR FORMATION:
   - PROTECT CELL AREA MASKING, ONO ETCHING, WET DIP.
   - GATE-OX (FOR TRANSISTORS).
   - P2 DEPOSITION, DOPING, MASKING, AND ETCHING.
   - N1DD AND P1DD MASKING AND IMPLANT.
   - LDD SPACER DEP AND ETCH BACK.
   - N+ AND P+ MASKING AND ETCH BACK.
   - TI (OR CO) DEP, RTP-1, STRIP, RTP-2.
6. BACKEND END PROCESS:
   - ILD DEP, CONTACT MASKING AND ETCH.
   - M 1 DEP, MASKING, AND ETCH.
   - IMD DEP, VIA MASKING AND ETCH.
   - M 2 DEP, MASKING, AND ETCH.

METHOD FOR FORMING FLASH MEMORY OF ETOX-CELL PROGRAMMED BY BAND-TO-BAND TUNNELING INDUCED SUBSTRATE HOT ELECTRON AND READ BY GATE INDUCED DRAIN LEAKAGE CURRENT

RELATED APPLICATIONS

This is a continuation-in-part of U.S. patent application Ser. No. 09/378,197 filed Aug. 19, 1999 entitled "ETOX-Cell Programmed by Band-to-Band Tunneling Induced Substrate Hot Electron and Read by Gate Induced Drain Leakage Current".

FIELD OF THE INVENTION

The present invention relates to EPROM tunnel oxide (ETOX) flash memory, and more particularly, to a method for fabricating an ETOX-cell that includes a p-type source and an n-type drain region.

BACKGROUND OF THE INVENTION

The stack-gate ETOX-cell, one of the most popular cell structures for flash memories, is widely programmed by channel hot-electron (CHE) and erased by Fowler-Nordheim (FN) tunneling through the source side or the channel area.

The n-channel ETOX-cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the highest potential (Vcc) and the p-well is biased to the lowest potential (Vss). The n+ source is typically doubly implanted by $As^{75}$ (with a high dose of $3E15/cm^2 \sim 1E16/cm^2$ for the n+ junction) and $p^{31}$ (with a lower dose of $\sim 1E14/cm^2$ for the n-junction) so that the source junction can be biased at high voltage (e.g. $\sim 12v$) during erase operation. The n+ drain is typically implanted by As only with a high dose ($\sim 1E16/cm^2$) and the drain side does not need the lightly-doped-drain (LDD) implant and spacer structure.

Note that the LDD structure is not useful in an ETOX-cell, although it is important in CMOS transistors for reducing electrical field during switching for lower hot-electron generation. The tunnel oxide ($T_{ox}$) is typically 80–120 angstroms thick, the inter-poly dielectric ($T_{pp}$) typically consists of thin oxide-nitride-oxide (ONO) layers. As an example, a typical ETOX-cell based on 0.35 urn CMOS design rule has the following cell parameters: $T_{ox} \sim 90$ angstroms, $T_{pp} \sim 160$ angstroms (oxide equivalent thickness), and control-gate to floating-gate coupling ratio of $\sim 0.8$.

The ETOX-cell of FIG. 1 is programmed by channel-hot-electrons (CHE). The bias for programming is typically: $V_d=7v$, $V_{cg}=9$ to $12v$, and $V_s=0v$. Under these bias conditions, there is a large channel current ($\sim 1mA/cell$) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is erased by Fowler-Nordheim (F-N) tunneling through the source side or the channel area. The bias during source side erase is typically: $V_d \sim 0v$ or floating, $V_{cg} \sim 5v$ to $0v$, and $V_s=+9$ to $+12v$. This establishes a large electrical field ($\sim 10Mv/cm$) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d \sim$ floating, $V_{cg} \sim 15v$, $V_{pw} \sim 0v$. A large electrical field ($-10Mv/cm$) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high electrical field during erase.

The read biases of the prior art ETOX-cell are typically: $V_d \sim 1v$ to $2v$, $V_{cg} \sim V_{cc}$, $V_s \sim 0v$, $V_{pw} \sim 0v$, $V_{dnw}=V_{cc}$, and $V_{sub} 0v$. The channel may be inverted or not depending on the net electron charge stored on the floating-gate, and results in the on and off of the cell as measured by the read current Iread representing the digital information of "1" or "0" stored in the cell.

The prior art ETOX-cell of FIG. 1 can be programmed by another method known as substrate-hot-electron (SHE) as shown in FIG. 2. As seen in FIG. 2, an additional n+ junction is needed (i.e., the "injection" junction) for injecting electrons through the forward-biased n+ injection junction to p-well junction. Unfortunately, most of the injected electrons are not diffused towards the channel area, but instead toward the nearby n+ source junction. Furthermore, the n+ source, p-well, and the n+ "injection" junction form a lateral npn bipolar transistor. The bipolar action of the npn bipolar transistor results in a large bipolar current at the node of n+ injection junction. Therefore, the SHE program scheme for the ETOX-cell is not only very slow but also requires a large cell size due to the additional "injection" junction. As a result, this type of SHE programming scheme is not popular in commercial EPROMs or ETOX flash memories.

Another more recent SHE was reported in I. C. Chen, Kaya, and J. Paterson, "Band-to-band Tunneling Induced Substrate Hot-electron (BBISHE) Injection: A New Programming Mechanism for Nonvolatile Memory Devices," Tech. Digest Intl. Electron Devices Meetings, p. 263, 1989. The hot electrons are generated by the impact ionization of energetic electrons, which are released by the band-to-band tunneling mechanism from the surface of a deep depleted p-type island in the middle of the channel area of the EPROM cell. The injection efficiency is very high (relative to conventional SHE) by generating hot electrons close to the channel area. However, the cell size is large due to the heavily doped additional p-type island.

What is needed is a method for manufacturing an improved ETOX-cell that solves the above problems of the prior art.

SUMMARY OF THE INVENTION

A method of forming an ETOX-cell and array in a semiconductor substrate is disclosed. The method comprises: forming a p-well within said substrate; forming a drain region in said p-well, said drain region of a first dopant type; forming a source region in said p-well; said source region of a second dopant type (i.e. same as the p-well); forming a floating-gate above said p-well, said floating-gate separated from said substrate by a thin oxide layer, said floating gate formed between said drain region and said source region and only after said drain region and said source region have been formed; and forming a control gate above said floating-gate, said floating-gate and said control gate separated by a dielectric layer.

The new ETOX cells can be organized into a not or (NOR) array, but with no need of source line connections. Each cell is programmed by band-to-band induced substrate hot-electron (BBISHE) at the source, and read by GIDL at the drain side.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 9A is a cell layout design for the ETOX cell of FIG. 3 with the n+ drain connected to a bit-line contact and metal line and a buried p+ source line; and FIG. 9B is a cell layout design for the ETOX cell of FIG. 3 with;

FIG. 10 is the process flow for forming the ETOX cell of FIG. 3 in accordance with the present invention.

DETAILED DESCRIPTION OF THE PREFERRED EMBODIMENT

Figure 1:
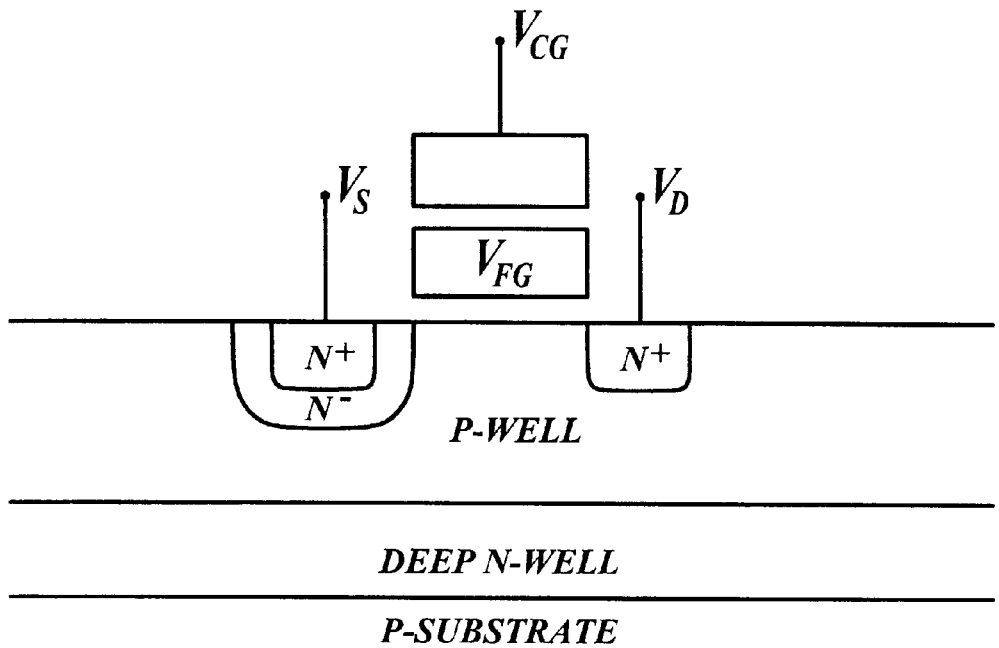
FIG. 1 is a schematic diagram of a prior art ETOX-cell formed by a triple-well process.
Figure 2:
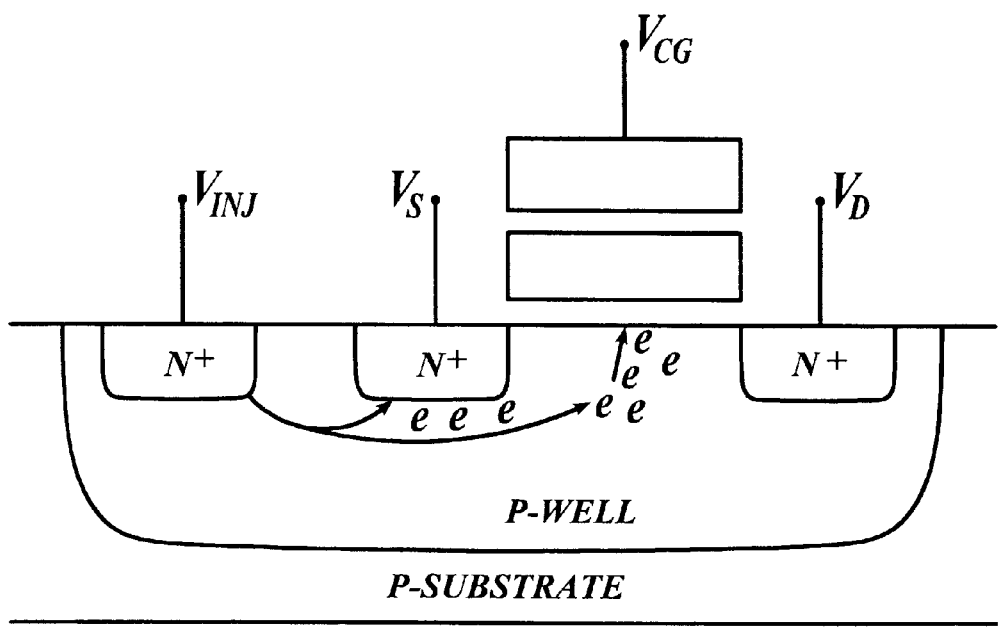
FIG. 2 is a schematic diagram of a prior art ETOX-cell using an injection junction.
Figure 3:
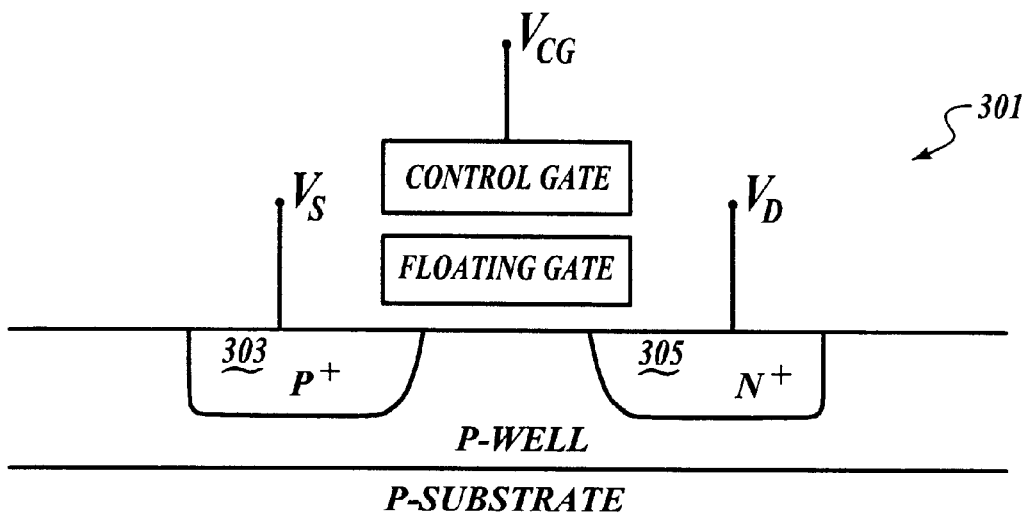
FIG. 3 is a schematic diagram of an ETOX-cell formed in accordance with the present invention.

Turning to FIG. 3, an ETOX-cell 301 formed in accordance with the present invention is shown. Note that the cell 301 is substantially similar to the n-channel ETOX-cell shown in FIG. 1, except that the n+ source in the prior art ETOX-cell has been replaced by a p+ region 303 (referred to as "p+ source"). Other features are the same as in a conventional ETOX-cell. For example, the tunnel oxide is ~80–100 angstroms thick, the interpoly dielectric between the control gate and the floating-gate is preferably oxide/nitride/oxide with about 100–180 angstroms (oxide equivalent) thickness. The control gate has a coupling ratio to the floating-gate of about 0.8.

As can be appreciated by those skilled in the art, the ETOX-cell 301 is actually not a MOSFET transistor, since the source 303 and drain 305 do not have the same dopant type. The p+ source 303 is simply a p+ contact to the p− substrate and p-well. The channel between the p+ source 303 and the n+ drain 305 can be inverted (by applying a high enough $V_{cg}$) and is electrically shorted to the n+ drain 305. However, there is no channel current flowing from the n+ drain 305 to the p+ source 303.

Figure 4:
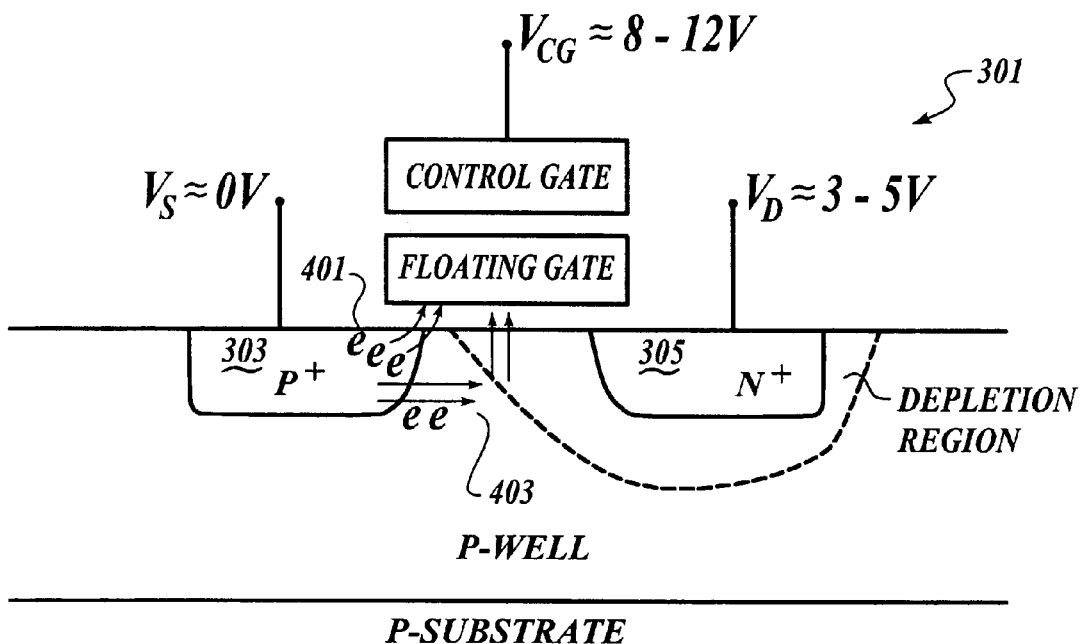
FIG. 4 is a schematic diagram of the ETOX-cell of FIG. 3 during programming.

The operation of the ETOX-cell 301 is described below. The ETOX-cell 301 is programmed by band-to-band tunneling induced substrate hot electron (BBISHE) programming at the p+ source 303 side. Turning to FIG. 4, the n+ drain 305 is biased to about 3 to 5 volts. The p+ source 303 (i.e. the p-type substrate) is biased to 0 volts. The control gate potential ($V_{cg}$) is biased high enough (8 to 12 volts) to invert the channel between the n+ drain 305 and the p+ source 303. The inverted channel, which is n-type and is shorted to the n+ drain 305, is therefore also biased to the drain bias ($V_d$). The control gate potential ($V_{cg}$) is also biased high enough, so that electrons are generated at the overlap surface of the p+ source 303 and the floating gate by band-to-band tunneling (BBT) mechanism.

There are two directions of flow for these electrons generated by BBT at the surface of the p+ source 303. First, some of them will flow directly toward the inverted channel, which is shorted to the n+ drain 305 and biased to $V_d$. Those electrons are accelerated or "heated up" by the electrical field in the depletion region between the inverted channel and the p+ source 303. Those electrons that are hot enough will be injected toward the floating-gate. This programming mechanism is similar to the known "source side injection". These electrons are represented by reference numeral 401.

Secondly, some of the electrons will simply flow into the p-well and are then accelerated or "heated up" by the field in the depletion region near the drain junction and adjoining with the inverted layer. When these electrons become hot enough, they can be injected through the inversion layer and toward the floating-gate. These electrons are represented by the reference numeral 403. This mechanism is the same as the substrate hot electron (SHE) injection.

In summary the BBISHE programming on the ETOX-cell 301 of the present invention is a combination of source side injection and SHE injection. Note that the programming process will continue (i.e. more negative charge onto the floating-gate) until the channel inversion layer disappears.

Figure 5:
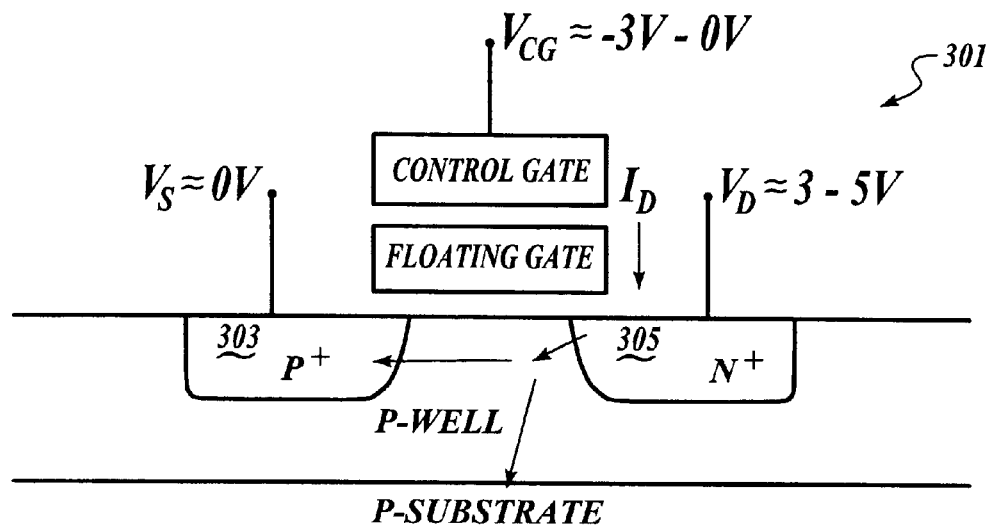
FIG. 5 is a schematic diagram of the ETOX-cell of FIG. 3 during a read operation.

Next, turning to FIG. 5, the read operation of the ETOX-cell 301 is next described. The read operation is based on the fact that the gate induced drain leakage (GIDL) current at the n+ drain 305 is strongly (exponentially) dependent on the electrical field between the drain 305 and the floating-gate. As a result, it is sensitive to the net charge on the floating-gate. The preferred bias for the read operation is as follows: $V_{cg}$ is 0 to −3 volts; $V_d$ is biased at 3 to 5 volts; and $V_s$ is 0 volts. The field between the drain and floating gate of a programmed cell (i.e. electron charge on the floating gate) is larger than that of a non-programmed cell (i.e. no charge on the floating gate), resulting in at least 3 orders of magnitude difference in the GIDL current measured at the n+ drain. The magnitude of drain current $I_d$ is therefore strongly modulated by the floating-gate charge and represents the digital information "one" and "zero" stored in the ETOX-cell 301. This type of read operation based on GIDL is novel to the present invention.

An analysis of the GIDL current during the read operation is shown below. The floating-gate potential ($V_{fg}$) can be estimated by the law of charge conservation, i.e.

$$C_{pp}(V_{fg}-V_{cg})+(C_s+C_d)(V_{fg}-V_d)+C_{ch}(V_{fg}-V_d)=Q_f$$

Or $$V_{fg} = Q_f/C_t + V_{cg}\gamma_g + V_d(\gamma_{d+}\gamma_{s+}\gamma_{ch})$$

Where $C_t = C_{pp} + C_s + C_d + C_{ch}$. The coupling ratios are defined as the following: $\gamma_g = C_{pp}/C_t$; $\gamma_d = C_d/C_t$; $\gamma_s = C_s/C_t$; $\gamma_{ch} = C_{ch}/C_t$; and $\gamma_g\gamma_{d+}\gamma_{s+}\gamma_{ch} = 1$. $Q_f$ is the net charge on the floating-gate. When the cell is not programmed (i.e. "0"), there is no net charge on the floating-gate, i.e. $Q_f = 0$. Thus, the floating-gate potential $V_{fg}$ for "0" during read is, $$V_{fg,0} = V_{cc}\gamma_d \quad \text{(cell in "0")}$$

When the cell is programmed (i.e. "1"), the maximum net charge on floating-gate at the end of programming can be estimated analytically by, $$Q_f/C_t \approx V_{to} - V_{cg(pg)}\gamma_g + V_{d(pg)}(\gamma_g + \eta)$$

where $V_{to}$ is the threshold voltage viewed from the floating-gate. $\eta$ is the coefficient of body-bias effect. Typically, $\eta \sim 0.15$. The $V_{cg(pg)}$ and $V_{d(pg)}$ are the biases during programming. See M. Chi et al., "A New Self-Convergent Programming and Erase Tightening by Substrate-Hot-Electron Injection for ETOX Cells in Triple Well," Paper G22, p. 199, International Symposium on VLSI Technology, Systems, and Applications, 1999. The read bias is $V_{cg} = 0_v$ and $V_d = V_{cc}$. Thus, from the above equations, the $V_{fg}$ for "1" during read operation is, $$V_{fg,1} = V_{to} - V_{cg(pg)}\gamma_g + V_{d(pg)}(\gamma_g + \eta) + V_{cc}\gamma_d \quad \text{(cell in "1")}$$

The surface electric field at the tunneling point in the overlap region between the drain and the floating-gate is $$E_{d,fg} = (V_d - V_{fg} - 1.12)/(3T_{ox})(\text{for n-type poly doping}) = (V_d - V_{fg})/(3T_{ox})(\text{for p-type poly doping})$$

where $T_{ox}$ is the tunnel oxide thickness. The constant 1.12 represents the band gap of silicon material. The GIDL current (i.e. the $I_{read}$) is exponentially related to the magnitude of the field $E_{d,fg}$, which is related to the floating gate potential $V_{fg}$.

$$I_{read} = AE_{d,fg} \exp(-B/E_{d,fg})$$

where A and B are constants. B is ~21.3 Mv/cm from the published literature. Notice that p-type poly doping results in larger $E_{d,fg}$ by $1.12/(3T_{ox})$. Using typical bias values, the difference of $V_{fg}$ between "1" and "0" will be greater than 3 volts. This can result in at least 3 orders of magnitude difference in GIDL current at the n+ drain.

Figure 6:
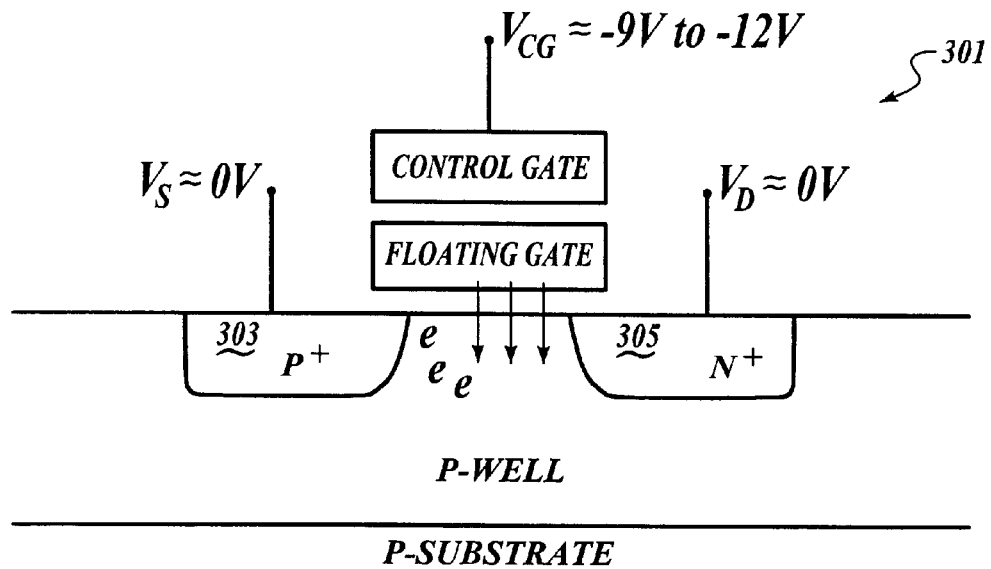
FIG. 6 is a schematic diagram of the ETOX-cell of FIG. 3 during an erase operation.

Turning to FIG. 6, the erase action of the ETOX-cell 301 can be seen. It is similar to conventional Fowler-Nordheim tunneling through the channel. There is a high enough field (>10 MV/cm) established between the n+ drain 305 and the floating-gate so that electrons on the floating-gate can tunnel by Fowler-Nordheim tunneling into the channel/drain/source area and be removed away. Preferably, the n+ drain 305 and the p+ source 303 are both grounded to zero volts and the control gate voltage $V_{cg}$ is ~-9 to -12 volts.

Alternatively, the erase mechanism can be performed by Fowler-Nordheim tunneling through the n+ drain 305 by applying a drain voltage of 5 volts. Due to the large GIDL current occurring at the drain during erase, this type of erase is not preferred for the ETOX-cell 301.

It should be noted that the new ETOX-cell 301 is particularly suitable for cells fabricated on silicon on insulator (SOI) wafers. The floating body effect is completely eliminated, since the p+ source 303 is simply the body contact of the device. All operations are the same as cells fabricated on bulk wafers.

There are several advantages of the ETOX-cell 301 of the present invention and its operation. First, the p+ source 303 is actually the contact to the p-substrate and p-well. Therefore, there is no need for a source interconnection as long as the p-well or p-substrate is grounded. A smaller cell size is thus more easily achieved. Second, the n+ drain 305 does not carry a large current during all operations. Therefore, a buried n+ line (i.e. diffusion area used as n+ drain) is suitable for cell operations. This will eliminate the contact and metal interconnect of n+ drains and further reduce the cell size. Third, the BBISHE programming and Fowler-Nordheim erase through the channel are all low current and low power operations. Finally, the GIDL read operation is insensitive to temperature due to the nature of the GIDL mechanism.

With the structure and operation of the ETOX-cell 301 fully described above, next will be presented a method for efficiently manufacturing the ETOX-cell 301.

There are several key considerations in fabricating the ETOX-cell 301 together with conventional CMOS logic. First, the n+ drain 305 and the p+ source 303 in the ETOX-cell 301 have the requirement of maximum GIDL current generation. This is in contrast to the requirement of minimizing GIDL current in conventional CMOS transistors. Therefore, the n+ drain 305 and the p+ source 303 should be fabricated before the formation of the floating gate (using masking and high dose implant steps).

Second, the cell 301 does not need a lightly doped drain (LDD) implant and spacer. However, to be made more compatible with CMOS processes, spacers may be formed on the sidewalls of the floating gate without adverse effects as long as the n+ drain and p+ source are formed before the formation of the floating-gate. Thus, the spacers need not be removed for the ETOX-cell 301 (otherwise another masking step and wet etching step would be needed).

Third, the polysilicon floating gate in the ETOX-cell 301 is preferred to have a p-type doping (such as with boron) for enhancing the GIDL current at the n+ drain 305 surface during the read operation (due to the field increase from the band gap of ~1.12 volts potential) compared with a typical n-type doped polysilicon floating gate. Therefore, as a trade off, the GIDL current at the p+ source 303 is reduced by the band gap differences from the p-type floating gate. However, the programming only requires a small GIDL current at the p+ source 303.

Figure 7:
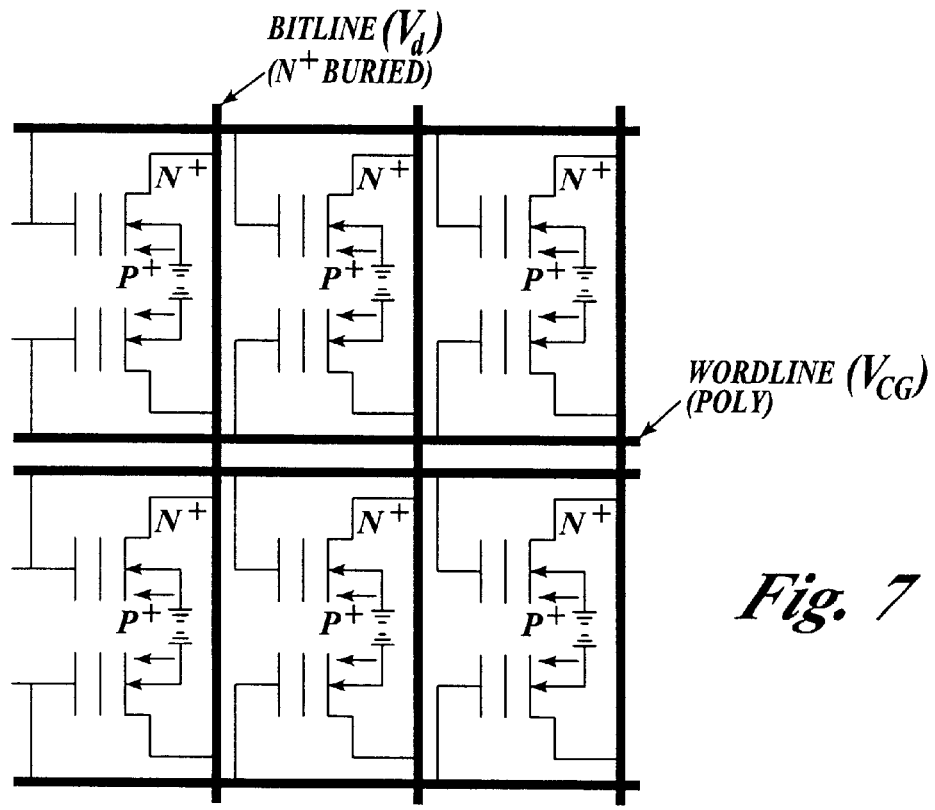
FIG. 7 is a NOR array formed from the ETOX cells of the present invention.

The ETOX-cells 301 can be organized into a NOR array as shown in FIG. 7 with the following features. The n+ drains are connected to a column bitline through a buried n+ region (contactless array) or by a conventional contact and metal line. The control gate of cells are connected to the word line. There is no need for a p+ source connection since the bias is applied from the p-well or the p-substrate (i.e. always grounded).

The memory operations in array are as follows. During programming (for example a single cell), the selected column ($V_d$) is biased to high (e.g. 3.3 volts), and the selected word line ($V_{cg}$) is biased to high (e.g. 8 to 12 volts). All non-selected column bitlines are biased to 0 volts and the non-selected word lines are biased to 0 volts. To program cells in an entire row, all column bitlines are selected and biased according to the input digital information (e.g. bitline bias to 3 volts as a "1" and 0 volts for a "0"). The selection wordline is biased to high (e.g. 8 to 12 volts); all non-selected wordlines are biased to 0 volts.

To program all cells in a column, then all word lines are selected and biased according to the input digital information (e.g. 8 to 12 volts for a logical "1" and 0 volts for a logical "0"). The selected column bitline is biased to 3.3 volts, and all non-selected bit-lines are biased to 0 volts. In short, either single bit programming, column programming, or row programming can be implemented in this array with high efficiency.

During the read operation, the selected row wordline is biased to low (e.g. 0 volts to −3 volts), and selected column bitlines are biased to high (e.g. 2 volts to 3 volts). All non-selected row wordlines are biased to high ($V_{cc}$~3.3 volts) and all non-selected bitlines are biased to low (i.e. 0 volts). The magnitude of the GIDL current in a column bitline represents the digital information stored in the cell. Those cells programmed with (negative) electron charge on the floating-gate will have −3 orders of magnitude larger GIDL current than those without electrons on the floating-gate. This read operation is unique and distinguishable from conventional flash memory read operation.

During the erase operation, a selected row wordline can be erased by simply biasing to low (e.g. −6 volts to −12 volts). Cells are erased by Fowler-Nordheim tunneling through the channel area. Non-selected rows are biased to 0 volts. All column bitlines are biased to 0 volts. Certainly, more than one row or even all rows can be selected and erased efficiently.

Figure 8:
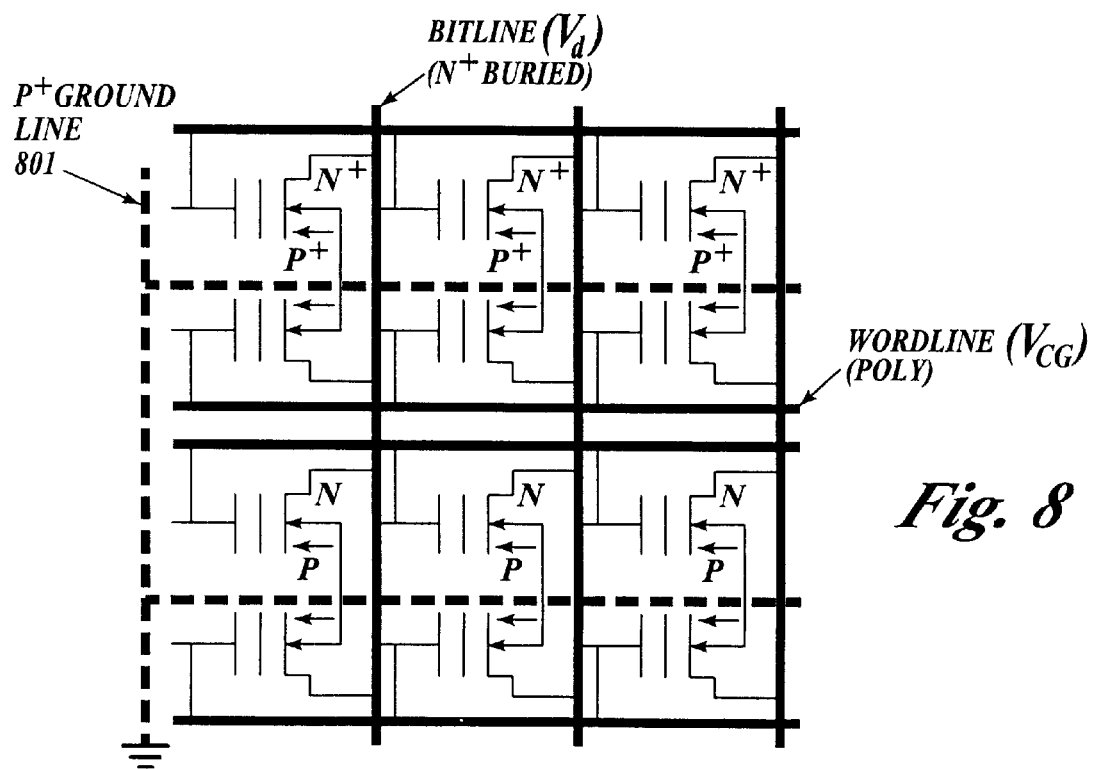
FIG. 8 is a NOR array formed from the ETOX cells of the present invention formed on a silicon-on-insulator wafer.

The new ETOX-cell 301 is also suitable for fabrication on silicon-on-insulator (SOI) wafers. The p+ source 303 in the array needs to be biased to ground and connected together either by a p+ buried layer 801 or by contacts and metal lines. FIG. 8 shows such an array. The memory operations are the same as described for FIG. 7. Notice that there is no problem of "floating body effect" or "parasitic bipolar effect" in this new ETOX cell and array fabricated on SOI as compared to conventional ETOX cells.

Figure 9:
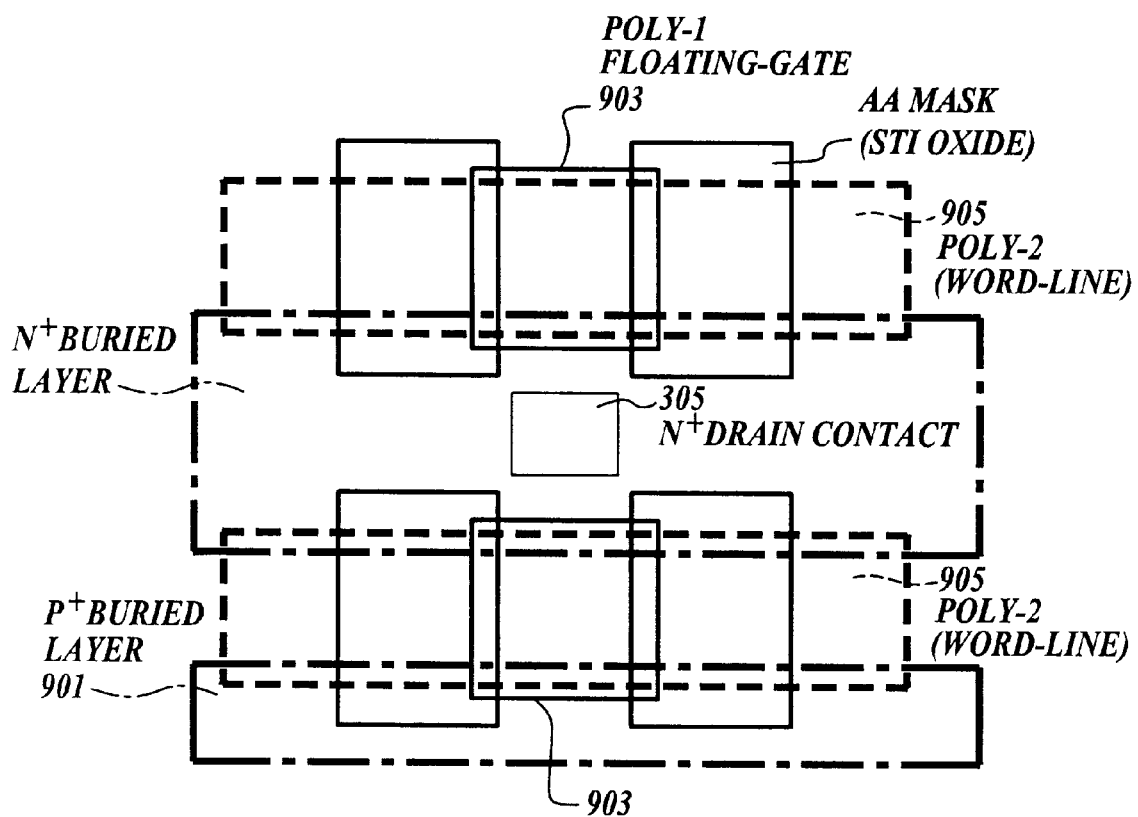

A top view of a layout design for the ETOX-cell 301 is shown in FIG. 9a, with the n+ buried drain 305 using contact and metal lines connected to bitline and a p+ buried line 901. Notice that the polysilicon floating gate 903 is designed to be simple islands rather than stripes so that self-aligned etch (SAE) process is not required. The misalignment among the buried n+ layer, p+ buried line 901, floating gate 903, and wordline 905 do not strongly affect cell operations.

The new ETOX-cell 301 can be fabricated using conventional ETOX flash memory flows by adding two additional masking steps to form the buried n+ layer and buried p+ layer. Also, the floating gate polysilicon doping is changed to p-type by boron implant. FIG. 10 shows a typical process flow for fabricating the ETOX-cell 301 together with advanced CMOS logic (0.25 micron and below) with shallow-trench-isolation front-end isolation and salicide transistors.

Figure 11:
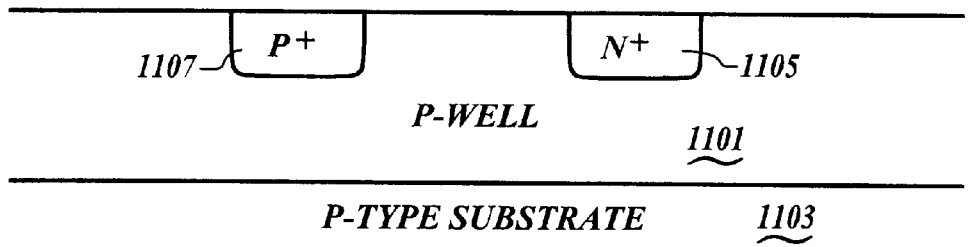
FIGS. 11–13 illustrates cross-sectional views of a method for forming the ETOX cell of FIG. 3 in accordance with the present invention.
Figure 12:
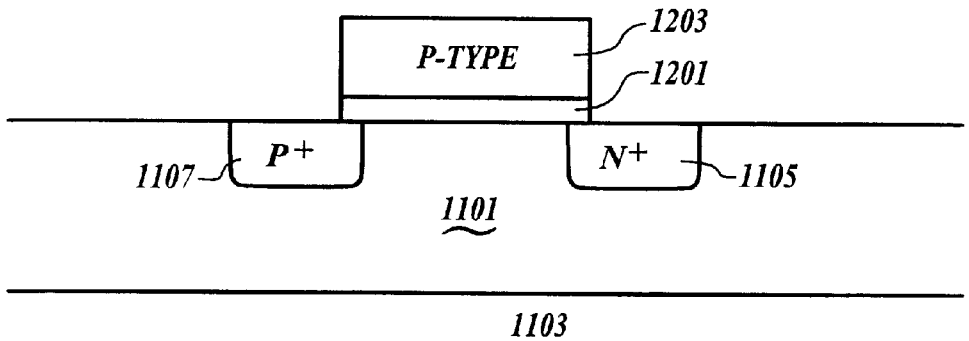
Figure 13:
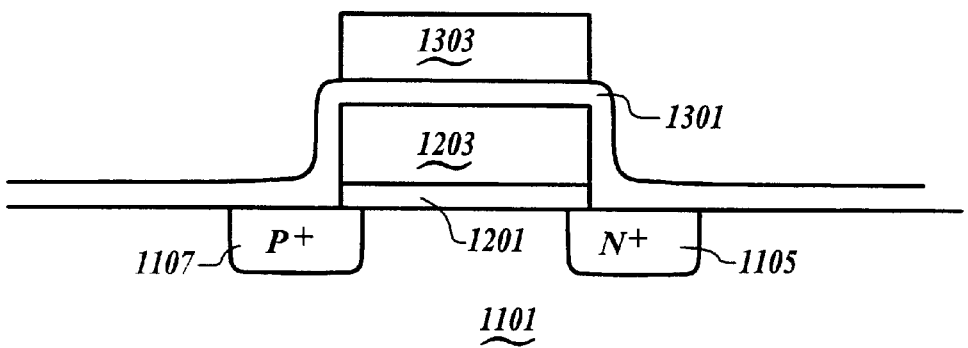

In accordance with the present invention, FIGS. 11–13 illustrate a preferred method for forming the ETOX cell 301. First, in FIG. 11, a p-well 1101 is formed in a substrate 1103 (in this case, the substrate is p-type). The formation of the p-well can be done using conventional ion implantation techniques. Next, an n+ drain 1105 and the p+ source 1107 is formed in the p-well 1101 using masking and ion implantation techniques. Importantly, note that the n+ drain 1105 and the p+ source 1107 are formed prior to the formation of a floating gate. This is unlike the prior art, where the floating gate is used as a mask for forming self-aligned source and drain regions.

Next, turning to FIG. 12, a tunnel oxide 1201 is formed on the p-well surface, preferably by thermal oxidation. A first layer of polysilicon (poly1) 1203 is then deposited atop of the tunnel oxide 1201. The first polysilicon layer 1203 is doped with a p-type dopant, such as boron, by either insitu doping or by ion implantation. The first polysilicon layer 1203 and the tunnel oxide 1201 are then patterned and etched to form a floating gate between the n+ drain 1105 and the p+ source 1107. Note that there is enough overlap area between the floating gate and the n+ drain as well as p+ source as shown in FIG. 12.

Turning to FIG. 13, the remaining steps are conventional and include the formation of an oxide/nitride/oxide stack 1301 over the floating gate and the formation of a control gate 1303. The CMOS logic transistor gates are formed at the same step of control gate formation. The rest of the process is the same as usual logic process shown in FIG. 10.

Note that a corresponding ETOX cell with p+ drain and n+ source by reversing the polarity of the doping and operation bias is practically difficult because the corresponding cell does not work since the substrate-hot-hole injection is difficult. The energy barrier for hot hole injection is larger than electron injection. Further, the hot holes injection will degrade tunnel oxide significantly.

While the preferred embodiment of the invention has been illustrated and described, it will be appreciated that various changes can be made therein without departing from the spirit and scope of the invention.

The embodiments of the invention in which an exclusive property or priviledge is claimed are defined as follows:

1. A method of forming an ETOX-cell in a semiconductor substrate, said method comprising:

forming a p-well within said substrate;

forming a drain region in said p-well, said drain region of a first dopant type;

forming a source region in said p-well; said source region of a second dopant type;

forming a floating-gate above said p-well, said floating-gate separated from said substrate by an oxide layer, said floating gate formed between said drain region and said source region and only after said drain region and said source region have been formed; and forming a control gate above said floating-gate, said floating-gate and said control gate separated by a dielectric layer.

2. The method of claim 1 wherein said first dopant type is n-type and said second dopant type is p-type.

3. The method of claim 1 wherein said floating gate is doped with a p-type dopant.

4. A NOR array architecture allowing single bit, row, and column programming and row erase operations, said NOR array architecture comprising:

a plurality of ETOX cells formed in a p-well, each of said ETOX cell having:
  (1) a control gate;
  (2) a floating gate insulated from and formed underneath said control gate;
  (3) an n-type drain formed in said p-well adjacent to said floating gate; and
  (4) a p-type source formed in said p-well adjacent to said floating gate;

wherein said ETOX cells are formed into a two-dimensional array including a plurality of rows and a plurality of columns;

further wherein each of said control gates of said ETOX cells sharing a common row are connected to a row wordline;

further wherein each of said n-type drain of said ETOX cells sharing a common column are connected to a column bitline; and further wherein each of said p-type source of said ETOX cells is connected to said p-well.

5. The array of claim 4 wherein said p-type source and said p-well of said ETOX cells are grounded.

* * * * *